United States Patent [19]

Mishima et al.

[11] Patent Number: 5,179,729
[45] Date of Patent: Jan. 12, 1993

[54] TUNER STATION SELECTING APPARATUS

[75] Inventors: Akira Mishima, Ibaraki; Kazuhiko Kubo, Mishima; Akira Usui, Takatsuki, all of Japan

[73] Assignee: Matsushita Electric Industrial Co., Ltd., Osaka, Japan

[21] Appl. No.: 481,563

[22] Filed: Feb. 20, 1990

[30] Foreign Application Priority Data

Feb. 17, 1989 [JP] Japan .................. 1-38581
Feb. 27, 1989 [JP] Japan .................. 1-49569

[51] Int. Cl.⁵ .............................................. H04B 1/16
[52] U.S. Cl. .................. 455/260; 455/165.1; 455/265; 455/316
[58] Field of Search ............ 455/164, 165, 173, 182, 455/183, 186, 192, 265, 257–260, 314–317; 358/191.1

[56] References Cited

U.S. PATENT DOCUMENTS

| | | |
|---|---|---|
| 3,999,130 | 12/1976 | Whisler . |
| 4,512,035 | 4/1985 | Victor et al. . |
| 4,551,856 | 11/1985 | Victor et al. .................. 455/183 |
| 4,556,988 | 12/1985 | Yoshisato .................. 455/182 |
| 4,575,761 | 3/1986 | Carlson et al. .................. 358/191.1 |
| 4,581,643 | 4/1986 | Carlson . |

FOREIGN PATENT DOCUMENTS 0012129 2/1981 Japan .
0069927 4/1982 Japan .
84/04637 11/1984 World Int. Prop. O. .

Primary Examiner—Reinhard J. Eisenzopf
Assistant Examiner—Chi H. Pham
Attorney, Agent, or Firm—Wenderoth, Lind & Ponack

[57] ABSTRACT

A tuner station apparatus includes a first mixer for combining an input signal and a first local oscillation signal, and a second mixer for combining an output of the first mixer and a second local oscillation signal. The first and second local oscillation signals are generated by first and second PLL circuits, respectively. Each of the first and second PLL circuits include a frequency divider, a variable frequency divider, a phase comparator, a low pass filter, and a voltage controlled oscillator. The frequency divider of the first PLL circuit has a higher frequency division ratio than that of the second PLL circuit.

1 Claim, 3 Drawing Sheets

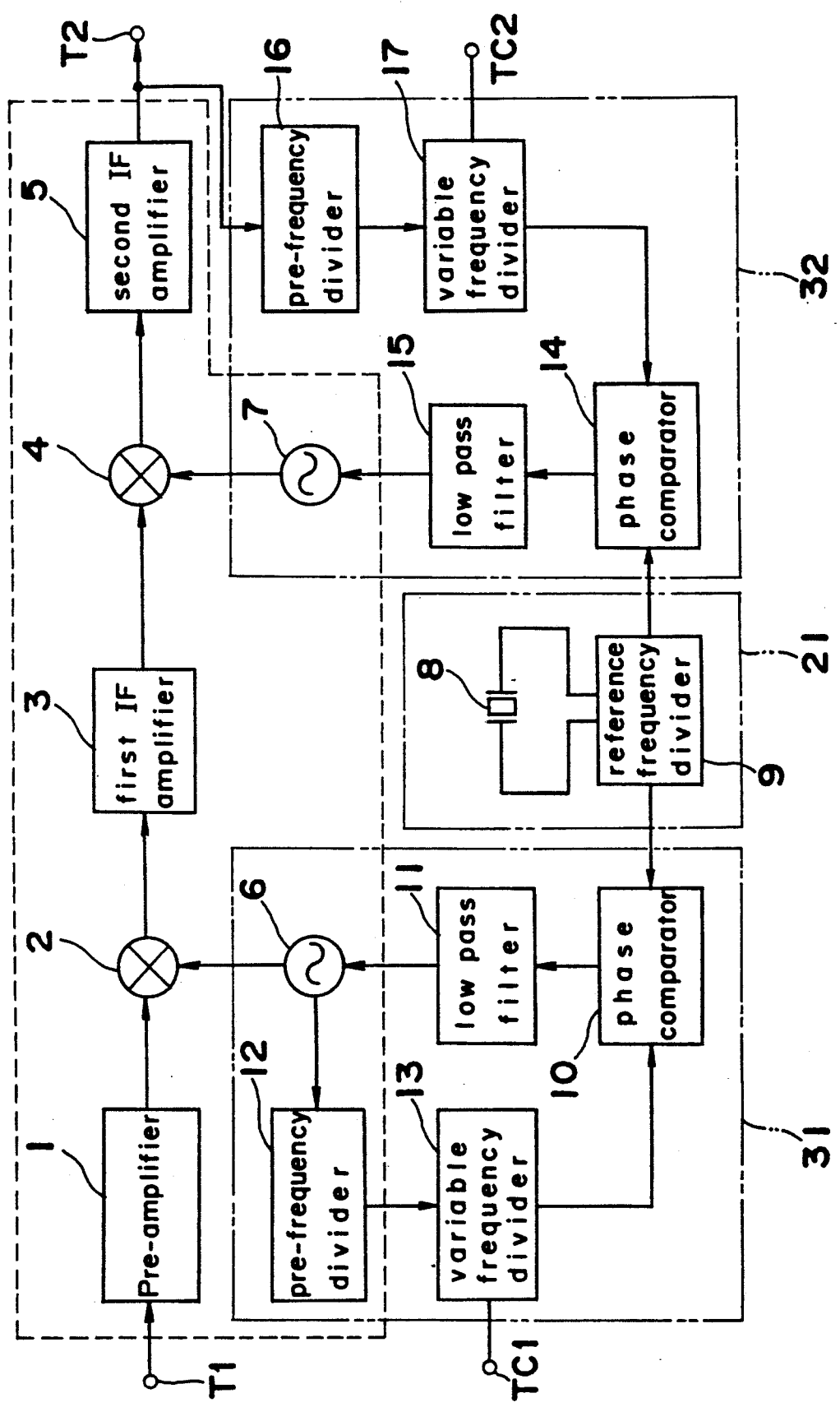

TUNER STATION SELECTING APPARATUS

BACKGROUND OF THE INVENTION

The present invention generally relates to a tuner station selecting apparatus, having has at least two local oscillators, such as an up, down tuner station selecting apparatus used, for example, in a CATV system.

Generally, for example, in CATV an American system, since the frequency band thereof ranges from 54 through 440 M Hz, a tuner station selecting apparatus of a double superheterodyne type is normally used. The tuner station selecting apparatus of a double superheterodyne type is also referred to as an up, down tuner station selecting apparatus. Such an apparatus converts a received high-frequency signal into a first intermediate frequency signal by the conversion from the upper side station so as to attenuate the image interference signal, and thereafter, to convert it into a second intermediate frequency signal free from the image interference by the conversion from a lower side station. The basic construction of such a tuner station selecting apparatus is shown in FIG. 1.

The high-frequency signal from an antenna is inputted into a pre-amplifier 1 from an input terminal T1 and is amplified. The amplified high-frequency signal is mixed with a signal from a first local oscillator 6 using a first mixer 2 so as to be converted into a first intermediate frequency signal by the conversion from the upper side station. The first intermediate frequency signal is amplified by a first intermediate frequency amplifier 3, is removed in the image interference signal, and is given to a second mixer 4. The signal is mixed with a signal from the second local oscillator 7 by the second mixer 4 and is converted into a second intermediate frequency signal by the conversion from the lower side station. The signal from the mixer 7 is given to the second intermediate frequency amplifier 5 so as to be amplified, and is guided into an output terminal T2.

The first local oscillator 6 is composed of a voltage control type of oscillator. The output of the local oscillator 6 is divided in frequency by a certain uniform frequency division ratio (for example, 1:64) in the pre-frequency-divider 12, and thereafter, is divided in frequency at a frequency division ratio corresponding to the control signal from the input terminal TC1 with a variable frequency divider 13. The output of the variable frequency divider 13 is given to a phase comparator 10 so as to compare in phase with a reference frequency signal from the reference frequency signal generating circuit 21 composed of an oscillating circuit for crystal oscillator 8 and a reference frequency divider 9. The output of a phase comparator 10 is converted into a control voltage for controlling the local oscillator 6 by a low-pass filter 11. A PLL (phase locked loop) frequency synthesizer is composed of a local oscillator 6, a pre-frequency divider 12, a variable frequency divider 13, a phase comparator 10 and a low-pass filter 11 and so on. The control signal from the input terminal TC1 is changed to change the frequency of the signal from the local oscillator 6 so as to select the high-frequency signal to be converted into the first intermediate frequency signal for turning into the signal of a specific frequency.

For example, the frequency division ratio of the pre-frequency-divider 12 is set at 1:64. The change amount ΔF of the oscillation frequency of the first local oscillator 7 due to the change of the 1 step of the frequency division ratio in the variable frequency divider 13 at this time is as follows, $$\Delta F = 64 \times 1 (K\ Hz) \quad (1)$$

wherein the frequency of the reference frequency signal from the reference frequency signal generating circuit 21 is 1 (K Hz).

Therefore, the high-frequency signal from the input terminal T1 may be received for each 64 (K Hz).

The second local oscillator 7 is composed of a voltage control type oscillator which frequency-discriminates in the second intermediate frequency the signal fed through a limiter 20 from the second intermediate frequency amplifier 5 by a frequency discriminator 19, and is controlled by a control voltage provided through the inputting operation of the output of the frequency discriminator 19 into the low-pass filter 18. An AFC (Automatic Frequency Control) circuit is composed of the limiter 20, a frequency discriminator 19, a low-pass filter 18, a second local oscillator 7 and so on. The stabilization of the second intermediate frequency signal which is guided into the output terminal T2 from the second intermediate frequency amplifier 5 is effected by the AFC circuit. It is to be noted that the block defined by broken lines in FIG. 1 shows a tuner housing member.

In such a prior art as described hereinabove, the operation of the above-described AFC circuit is temporarily interrupted by a construction shown at the switching operation of the station selection for switching the high-frequency signal to be tuned. In such a case, when the oscillation frequency of the second local oscillator 7 has been changed beyond the AFC retracting range due to the changes in the temperature and the humidity, an erroneous operation is caused in the AFC circuit.

Assume the first intermediate frequency is, for example, 965 M Hz. Therefore, when two channels (96 through 103 M Hz) of the Japanese television broadcasting operation are received, the oscillation frequency of the first local oscillator 7 is 1062.25 M Hz. At this time, the sixth higher harmonic of the output signal of the pre-frequency-divider 12 (the frequency divider ratio is 1:64) is caused near 99.58 M Hz. The sixth higher harmonic applies undesirable influences upon the high-frequency signal from the input terminal T1, thus resulting in a deteriorated receiving condition of the two channels. Thus, it is necessary to reduce the influences thereof by the provision of the lower output frequency of the pre-frequency-divider 12 so as to increase the degree of the higher harmonic component which becomes interferences with respect to the received signal. When the frequency division ratio of the pre-frequency-divider 12 is made larger to reduce the influences, the change amount ΔF in the oscillation frequency of the local oscillator 6 with respect to the 1 step of the frequency division ratio of the variable frequency divider 13 becomes larger, so that fine adjustment of the received frequency cannot be effected.

SUMMARY OF THE INVENTION

Accordingly, a first object of the present invention is to provide an improved tuner station selecting apparatus which is capable of better effecting a station selecting operation.

A second object of the present invention is to provide a tuner station selecting apparatus which is simple in the construction of a tuner metal fitting, and has the same function as before.

In accomplishing these and other objects, according to one preferred embodiment of the present invention, there is provided a tuner station selecting apparatus which includes a first mixer for mixing the signal from a local oscillator of a first PLL circuit with an input signal, and a second mixer for mixing a signal from a local oscillator from a second PLL circuit with a signal from the first mixer, and which is characterized in that the first PLL circuit includes a first pre-frequency-divider to which the output signal of a first local oscillator is given, a first variable frequency divider to which the signal from the first pre-frequency-divider is given, with the frequency division ratio being variable, a first phase comparator to which the output signal of the first variable frequency divider and the reference frequency signal thereof are given, and a first low-pass filter developing a control voltage for controlling the first local oscillator from the output signal of the first phase comparator, the second PLL circuit includes a second pre-frequency-divider to which the output signal of a second local oscillator is given, a second variable frequency divider to which a signal from the second pre-frequency-divider is given, with the frequency division ratio being variable, a second phase comparator to which the output signal of the second variable frequency divider and the reference frequency signal thereof are given, and a second low-pass filter developing the control voltage for controlling the second local oscillator from the output signal of the second phase comparator.

A tuner station selecting apparatus of a second invention is characterized in that a second local oscillation frequency signal from the output terminal of the second intermediate frequency amplifier for amplifying the output signal (second upper, lower signal) of the second mixer is obtained so as to add it into a second re-amplifier.

According to the construction of a first invention, the oscillation frequency of a second local oscillator is set so that the output signal of a second variable frequency divider a second PLL circuit is provided with may be locked in phase into the reference frequency signal. When the second PLL circuit is activated again if the operation of the second PLL circuit is interrupted and the oscillation frequency of a second local oscillator changes due to the external factors such as temperature, humidity and so on at the switching operation or the like of the received frequency, the oscillation frequency of the second local oscillator is correctly set to a value to be prescribed by the frequency division ratio of the second variable frequency divider. Accordingly, the station selecting operation is not caused at the switching operation or the like of the received frequency.

Also, the frequency division ratio of a first pre-frequency-divider the first PLL circuit for a first local oscillator use has is selected larger than the frequency division ratio of the second pre-frequency-divider the second PLL circuit has. Therefore, the frequency division ratio of a first pre-frequency-divider may be selected so that the higher harmonic which interferes with the received signal in the higher harmonic of the output signal becomes comparatively higher in order. Therefore, the bad influences upon the received signal by the higher harmonic of the output signal of the first pre-frequency-divider may be reduced.

The frequency division ratio of the second pre-frequency-divider is selected comparatively small. The unit change amount of the oscillation frequency of the second local oscillator is made smaller in this manner so as to make it possible to effect the fine adjustment of the received frequency.

According to the second invention, the second local oscillation frequency signal which leaks into the output of the second intermediate frequency amplifier is obtained so that the signal is adapted to be inputted into the pre-frequency divider of the second PLL, thus allowing the number of the connection terminals to be reduced.

BRIEF DESCRIPTION OF THE DRAWINGS

These and other objects and features of the present invention will become apparent from the following description taken in conjunction with the preferred embodiment thereof with reference to the accompanying drawings, in which;

FIG. 3 is a block diagram of a station selecting apparatus in a second embodiment of the present invention.

DETAILED DESCRIPTION OF THE INVENTION

Figure 1:
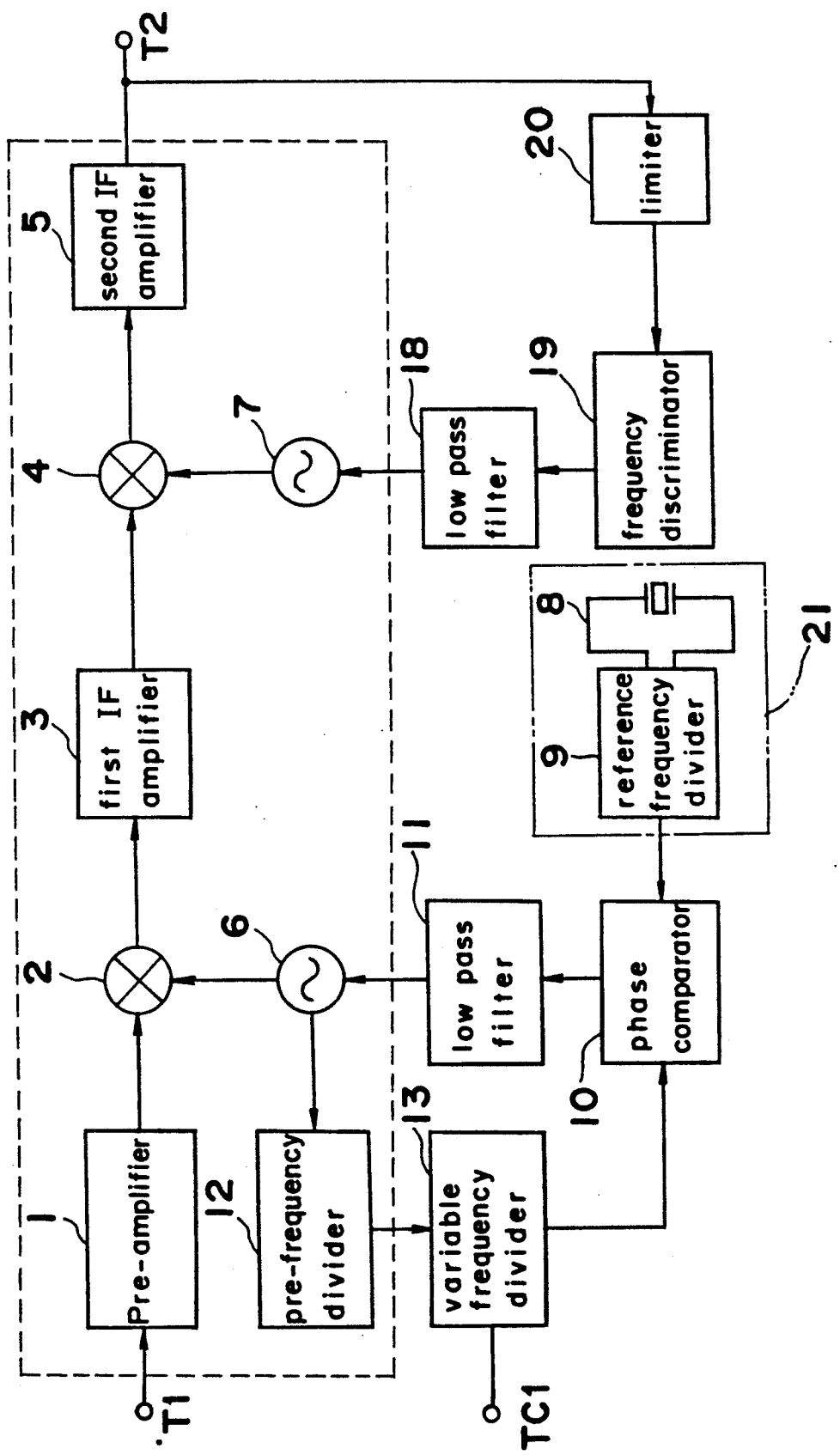
FIG. 1 is a block diagram of the conventional tuner station selecting apparatus.

Before the description of the present invention proceeds, it is to be noted that like parts are designated by like reference numerals throughout the accompanying drawings.

Embodiment

Figure 2:
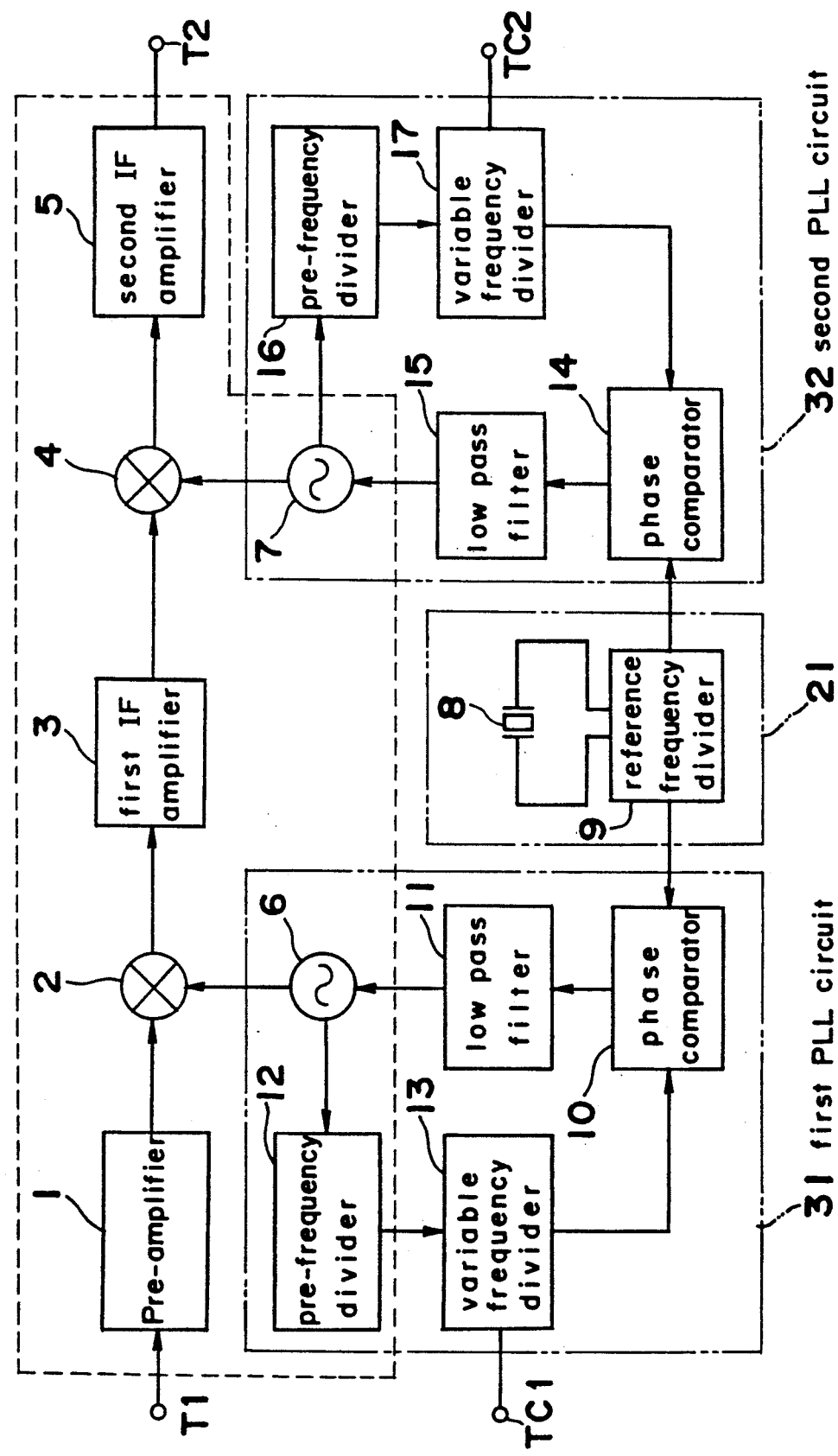
FIG. 2 is a block diagram of a station selecting apparatus in a first embodiment of the present invention.

Referring now to the drawings, there is shown in FIG. 2, a block diagram of the basic construction of a tuner station selecting apparatus according to one embodiment of the invention. Also, the block defined by broken lines shows a tuner housing member.

In the tuner station selecting apparatus, there is provided a first PLL circuit 31 including a first pre-frequency-divider 12, a first variable frequency divider 13, a first phase comparator 10 and a first low-pass filter 11 in connection with the first local oscillator 6, and a second PLL circuit 32 including a second pre-frequency-divider 16 for frequency-dividing by a certain uniform frequency division ratio the output of the second local oscillator 7, a second variable frequency divider 17 to which the signal from the second pre-frequency-divider 16 is inputted, the frequency division ratio thereof being changed by the control signal from the input terminal TC2, a second phase comparator 14 for comparing in phase the signal from the second variable frequency divider 17 with the reference frequency signal from the reference frequency divider 9 of the reference frequency signal generating circuit 21, a second low-pass filter 15 making a control voltage for controlling the oscillation frequency of the second local oscillator 7 from the output of the second phase comparator 14. The reference frequency signal generating circuit 21 is adapted to be used with common in the first and second PLL circuits 31, 32.

The respective frequency ratios N, M of the first, second pre-frequency-dividers 12, 16 to be respectively contained in the first and second PLL circuits 31, 32 are selected as follows, $$N > M \tag{2}$$

In the embodiment, a first intermediate frequency is 965 M Hz in the first mixer 2. The oscillation frequency of the first local oscillator 6 varies in accordance with the control signal from the input terminal TC1 within the range of 1056.25 through 1730.25 M Hz. For example, when the two channels of Japanese television broadcasting is received, the frequency of the signal to be received from among the high-frequency signals from the input terminal T1 is 96 through 103 M Hz. If the frequency division ratio of the pre-frequency-divider 12 is 1:256 when television broadcasting of two channels has been received with the oscillation frequency of the first local oscillator 6 being 1062.25 M Hz, the 24th higher harmonic of the pre-frequency-divider 12 is generated near the frequency 99.58 M Hz. The degree of the higher harmonic which becomes interferences with respect to the input signal becomes higher than in the above-described conventional tuner station selecting apparatus, so that the influences become smaller so as to restrain the interferences with respect to the received signal.

The frequency change $\Delta f$ per step in the minimum fine adjustment frequency of the first local oscillator 6, namely, the frequency per step in the movable frequency divider 13 is as follows.

$$\Delta f = 256 \times fr = 256(K\ Hz) \tag{3}$$

wherein the frequency of the reference frequency signal from the reference frequency signal generating circuit 21 is fr (=1 K Hz). In the above-described conventional tuner station selecting apparatus, the frequency change $\Delta F$ per step in the variable frequency divider 13 is 64 k Hz, so that the received frequency may be changed for each 64 K Hz. In the embodiment, in the second pre-frequency-divider 16 of the second PLL circuit 32, the frequency division ratio is set at 1:64. Accordingly, the change in the oscillation frequency of the second local oscillator 7 per step of the variable frequency divider 17 by the control signal from the input terminal TC2 is considered 64 K Hz. Despite the selection of the large frequency division ratio of the first pre-frequency-divider 12 of the first PLL circuit 21, the received frequency may be changed for each 64 K Hz.

At the switching operation of the received frequency, the second PLL circuit 32 is interrupted in the operation thereof by the construction not shown as the operation of the AFC circuit in the conventional embodiment is interrupted in the conventional embodiment. When the second PL circuit 32 is operated again, if the oscillation frequency of the second local oscillator 7 composed of a voltage control type oscillator transitionally changes due to factors such as temperature, humidity and so on in the embodiment, the second PLL circuit 32 locks in phase the output signal of the movable frequency divider 17 with respect to the reference frequency signal from the reference frequency signal generating circuit 21. The oscillation frequency of the second local oscillator 7 is correctly set at a value corresponding to the control signal from the input terminal TC2, so that erroneous operations in the station selection are not caused.

According to the tuner station selecting apparatus of the invention, the oscillation frequency of a second local oscillator is set so that the output signal of a second variable frequency divider of a second PLL circuit is set to be locked in phase into the reference frequency signal. When the second PLL circuit is activated again, if the operation of the second PLL circuit is interrupted and the oscillation frequency of the second local oscillator changes due to the external factors such as temperature, humidity and so on at the switching operation or the like of the received frequency, the oscillation frequency of the second local oscillator is correctly set to a value to be prescribed by the frequency division ratio of the second variable frequency divider. Accordingly, the station selecting operation is not effected at the switching operation and so on of the received frequency.

Also, the frequency division ratio of a first pre-frequency-divider of the first PLL circuit may be selected so that the higher harmonic which interferes with the received signal in the higher harmonics of the output signal becomes comparatively higher in order. Therefore, the undesirable influences upon the received signals by the output signal of the first pre-frequency-divider may be reduced.

The station selecting operation with respect to the received signal may be better effected in this manner.

The second embodiment will be described hereinafter with reference to FIG. 3. The example of FIG. 3 shows a further improved circuit of FIG. 2.

In the circuit construction of FIG. 2, the oscillation output signal of the second local oscillator 7 is required to be fed into the second pre-frequency-divider 16 through the output terminal with the output terminal for the exclusive use being provided in the tuner housing member. In this case, a through capacitor and so on are inevitably used and many connection portions are provided, with a problem arising in that the design of the tuner housing member is made complicated. The example of FIG. 3 settles this task.

FIG. 3 shows a station selecting apparatus in the second embodiment of the present invention, which includes a pre-amplifier 1, a first mixer 2, a first intermediate frequency amplifier 3, a second mixer 4, a second intermediate frequency amplifier 5, a first local oscillator 6, a second local oscillator 7, a crystal oscillator oscillating circuit 8, a reference frequency divider 9, first, second phase comparators 10, 14, first, second low-pass filters 11, 15, first, second pre-frequency-dividers 12, 16, first, second variable frequency dividers 13, 17, with the broken lines in the drawing showing a tuner housing member. The characteristic of the second embodiment is that the input into the second pre-frequency-divider 16 is obtained from the output of the second intermediate frequency amplifier 5.

The operation will be described hereinafter of a tuner station selecting apparatus having a construction as described hereinabove.

First, the input signal is given from the terminal T1 and is given to the first mixer 2 through the pre-amplifier 1. The first mixer 2 converts the input signal into the first intermediate frequency signal by the first local oscillator 6 so as to feed it into the first intermediate frequency amplifier 3. The first local oscillator 6 is fixedly divided in frequency by the first pre-frequency-divider 12, and the frequency dividing output thereof is variably divided in frequency by the first variable frequency divider 13. The output of the first variable frequency divider 13 is compared in phase with the output provided through the frequency division, by the reference frequency divider 9, of the reference oscillation frequency caused in the crystal oscillator oscillating circuit 8 by the first phase comparator 10. The detection output of the first phase comparator 10 effects the frequency control of the first local oscillator 6 through the first low-pass filter 11. The oscillation frequency of the first local oscillator 6 sets the frequency division ratio of the first variable frequency divider 13 so as to become a frequency higher by the first intermediate frequency than the frequency of the input signal.

The output of the first mixer 2 is fed into the second mixer 4 through the first intermediate frequency amplifier 3, is converted in the frequency with respect to the oscillation frequency of the second local oscillator 7 to obtain the second intermediate frequency signal so as to obtain the output from the terminal T2 through the second intermediate amplifier 5. The oscillation frequency of the second local oscillator 7 feeds into the second pre-frequency-divider 16 through the terminal T2 the second local oscillator frequency signal to be leaked through the second intermediate frequency amplifier 5 and the output is fed into the second variable frequency divider 17. The second pre-frequency-divider 16 and the second variable frequency divider 17 may be integrated, and the frequency divider may contain the zone amplifier of the second local oscillator frequency. The frequency of the frequency divider 17 is compared in phase with the signal of the reference frequency divider 9 by the second phase comparator 14. The detection output thereof controls the oscillation frequency of the second local oscillator 7 through the second low-pass filter 15.

As is clear from the foregoing description, according to the arrangement of the present invention, as the signal for phase-controlling the oscillation frequency of the second local oscillator 7, the second local oscillator frequency signal which leaks into the output of the second intermediate frequency amplifier 5 is obtained. The signal is fed into the external circuit (pre-frequency-divider 16, a variable frequency divider 17) so as to reduce the number of the connection terminals. As a result, the external connection portion of the tuner housing member, i.e., the connection location using the through capacitor may be reduced so as to reduce the cost of the parts, thus realizing a tuner station selecting apparatus which is more stable at a higher frequency and is simpler in construction.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A tuner station apparatus comprising:
   a first mixer for combining an input signal and a first local oscillation signal;
   a second mixer for combining an output of said first mixer and a second local oscillation signal;
   a first PLL circuit including (a) a first voltage controlled oscillator for generating the first local oscillation signal, (b) a first frequency divider for frequency dividing in accordance with a fixed first frequency division ratio 1:N the first local oscillation signal output by said first voltage controlled oscillator, (c) a first variable frequency divider for frequency dividing in accordance with a first variable frequency division ratio an output of said first frequency divider, (d) a first phase comparator for comparing an output of said first variable frequency divider and a reference signal, and (e) a first low-pass filter having input thereto an output of said first phase comparator and outputting a first voltage control signal for said first voltage controlled oscillator; and,
   a second PLL circuit including (a) a second voltage controlled oscillator for generating the second local oscillation signal, (b) a second frequency divider for frequency dividing in accordance with a fixed second frequency division ratio 1:M the second local oscillation signal output by said second voltage controlled oscillator, (c) a second variable frequency divider for frequency dividing in accordance with a second variable frequency division ratio an output of said second frequency divider, (d) a second phase comparator for comparing an output of said first variable frequency divider and the reference signal, and (e) a second low-pass filter having input thereto an output of said second phase comparator and outputting a second voltage control signal for said second voltage controlled oscillator;
   wherein $M<N$, and wherein a value of N is such that a high frequency disturbance of the input signal caused by said first PLL circuit is relatively small, and wherein a value of M is such that a fine tuning adjustment of the second PLL circuit is facilitated.

* * * * *